US00RE45819E

(19) United States
(12) Reissued Patent
Kajigaya

(10) Patent Number: US RE45,819 E
(45) Date of Reissued Patent: Dec. 15, 2015

(54) SEMICONDUCTOR DEVICE, SEMICONDUCTOR MEMORY DEVICE AND DATA PROCESSING SYSTEM COMPRISING SEMICONDUCTOR SYSTEM

(71) Applicant: PS4 LUXCO S.A.R.L., Luxembourg (LU)

(72) Inventor: Kazuhiko Kajigaya, Tokyo (JP)

(73) Assignee: PS4 Luxco S.a.r.l., Luxembourg (LU)

(21) Appl. No.: 14/302,867

(22) Filed: Jun. 12, 2014

Related U.S. Patent Documents

Reissue of:
(64) Patent No.: 8,199,559
Issued: Jun. 12, 2012
Appl. No.: 12/881,788
Filed: Sep. 14, 2010

(30) Foreign Application Priority Data

Sep. 15, 2009 (JP) ..... 2009-213432

(51) Int. Cl.
*G11C 11/24* (2006.01)
*G11C 7/06* (2006.01)
*G11C 11/4091* (2006.01)
*G11C 11/404* (2006.01)

(52) U.S. Cl.
CPC ..... *G11C 11/4091* (2013.01); *G11C 11/404* (2013.01)

(58) Field of Classification Search
CPC .... G11C 11/4091; G11C 11/404; G11C 7/12; G11C 7/06
USPC ..... 365/149, 191, 203, 205, 207
See application file for complete search history.

(56) References Cited

U.S. PATENT DOCUMENTS 5,367,481 A * 11/1994 Takase et al. ..... 365/149
5,610,540 A 3/1997 Althoff et al.
6,104,655 A * 8/2000 Tanoi et al. ..... 365/205
(Continued)

FOREIGN PATENT DOCUMENTS

JP 8-287692 A 11/1996
JP 9-297992 A 11/1997
(Continued)

OTHER PUBLICATIONS

Lawrence G. Heller, et al., "High Sensitivity Charge-Transfer Sense Amplifier," IEEE Journal of Solid-State Circuits, Oct. 1976, pp. 596-601, vol. SC-11, No. 5.
(Continued)

*Primary Examiner* — Adam L Basehoar
(74) *Attorney, Agent, or Firm* — Kunzler Law Group, PC

(57) ABSTRACT

A semiconductor device comprises a memory cell, a bit line, a sense amplifier operating between a first voltage and a second voltage higher than the first voltage, a transfer control circuit including a transfer transistor, and a write circuit writing data into the memory cell through the bit line based on the first voltage and a third voltage. The sense amplifier receives and amplifiers the signal voltage at a sense node when the transfer transistor controls the connection between the bit line and the sense node in response to a transfer control voltage. The third voltage is set to a voltage lower than the second voltage and higher than the transfer control voltage, and the sense node is set to a voltage higher than the transfer control voltage in an initial period of a read operation before the data of the memory cell is read out to the bit line.

34 Claims, 9 Drawing Sheets

(56) References Cited

U.S. PATENT DOCUMENTS

| | | | | |
|---|---|---|---|---|
| 6,115,284 | A * | 9/2000 | Matsumiya et al. | 365/149 |
| 6,507,222 | B1 * | 1/2003 | Jensen et al. | 327/51 |
| 6,594,187 | B2 * | 7/2003 | Ito | 365/203 |
| 7,324,394 | B1 * | 1/2008 | Yoon et al. | 365/205 |
| 7,551,474 | B2 * | 6/2009 | Kim | 365/149 |
| 2002/0105831 | A1 * | 8/2002 | Lee et al. | 365/185.21 |
| 2003/0081447 | A1 | 5/2003 | Hsu et al. | |
| 2005/0083746 | A1 * | 4/2005 | Joo et al. | 365/205 |
| 2009/0059702 | A1 * | 3/2009 | Sekiguchi et al. | 365/205 |
| 2010/0039173 | A1 * | 2/2010 | Chang et al. | 327/563 |
| 2010/0054065 | A1 | 3/2010 | Kajigaya et al. | |
| 2011/0063892 | A1 | 3/2011 | Kajigaya et al. | |
| 2013/0301364 | A1 | 11/2013 | Kajigaya et al. | |
| 2013/0315018 | A1 | 11/2013 | Kajigaya et al. | |
| 2014/0293721 | A1 | 10/2014 | Kajigaya et al. | |

FOREIGN PATENT DOCUMENTS

| | | | |
|---|---|---|---|
| JP | 11-016384 | A | 1/1999 |
| JP | 2007-073121 | A | 3/2007 |
| JP | 2010-55729 | A | 3/2010 |
| JP | 2011-65709 | A | 3/2011 |

OTHER PUBLICATIONS

Takayuki Kawahara, et al., "Bit-line Clamped Sensing Multiplex and Accurate High-Voltage Generator for 0.25μm Flash Memories," 1996 ISSCC Digest of Technical Papers, Feb. 1996, pp. 38-39.

Takayuki Kawahara, et al., "Bit-Line Clamped Sensing Multiplex and Accurate High Voltage Generator for Quarter-Micron Flash Memories," IEEE Journal of Solid-State Circuits, Nov. 1996, pp. 1590-1600, vol. 31, No. 11.

* cited by examiner

VARY = VDD = 1.0V

Cs = 10fF, Qs = 5fC

VARY = VDD = 0.5V

Cs = 20fF, Qs = 5fC

SEMICONDUCTOR DEVICE, SEMICONDUCTOR MEMORY DEVICE AND DATA PROCESSING SYSTEM COMPRISING SEMICONDUCTOR SYSTEM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

1. Field of the Invention

The present invention relates to a semiconductor device having a configuration in which data stored in memory cells is read out to bit lines and amplified by sense amplifiers.

2. Description of Related Art

Conventionally, semiconductor memory devices each provided with a sense amplifier which senses and amplifies data read out from a memory cell to a bit line have been known (Refer to, for example, Patent References 1 and 2). Further, a memory circuit using a charge transfer amplifier is known in relation to the Patent Reference 1 (Refer to Non-Patent References 1, 2 and 3). Particularly, the Patent Reference 1 discloses a memory cell MC of a gain cell type (a kind of DRAM cells) in which a gate of an output transistor M1 is used as a storage node SN shown in FIG. 8 and description thereof. This memory cell MC stores data in a capacitor (not shown) connected to the storage node SN. Operation of the memory cell MC of the gain cell type is performed so that data is written as a voltage at the gate (storage node SN) of the output transistor M1 and the data is read out by boosting the voltage of the storage node SN via the capacitor. The data is transmitted to a sense amplifier SA from the memory cell MC. Regarding this capacitor, the Patent Reference 1 does not disclose a specific structure or a write method for the capacitor.

[Patent Reference 1] Japanese Patent Application Laid-open No. 2007-73121

[Patent Reference 2] Japanese Patent Application Laid-open No. H11-16384

[Non-Patent Reference 1] L. G. Heller et al., "High sensitivity charge-transfer sense amplifier," IEEEJ. Solid-State Circuits, vol. SC-11, pp. 596-601, October 1976

[Non-Patent Reference 2] T. Kawahara et al., "Bit-line clamped sensing multiplex and accurate high-voltage generator for 0.25 μm flash memories," in 1996 ISSCC Dig. Tech. Papers, February 1996, pp. 38-39.

[Non-Patent Reference 3] T. Kawahara et al., "Bit-line clamped sensing multiplex and accurate high-voltage generator for quarter-micron flash memories," IEEE J. Solid-State Circuits, vol. 31, no. 11, pp. 1590-1599, November 1996

However, the configuration of the above conventional semiconductor memory device is mainly intended to achieve high-speed operation of the sense amplifier, and it is not taken into consideration that a write voltage for the memory cell is set sufficiently lower than an operation voltage of the sense amplifier. If a single-ended sense amplifier using a single MOS transistor connected to a single bit line is employed in order to reduce circuit scale of the sense amplifier, it is particularly desirable to reduce the write voltage. That is, when the write voltage for the memory cell is relatively large, consumption current increases due to charge/discharge current of the bit line. Further, data retention time of the memory cell is shortened due to influence of leak current from the memory cell (data storage node, exactly) to a substrate, and this causes various problems such as an increase in a boost voltage required for driving word lines.

Meanwhile, one of proposed configurations of the sense amplifier used in the DRAM includes a dynamic latch circuit having a plurality of MOS transistors arranged in a cross pattern (in which inputs and outputs of CMOS inverters are cross-coupled to each other). In this kind of the sense amplifier, since a pair of bit lines connected to the sense amplifier is precharged to an intermediate voltage between the write voltage for the memory cell and a ground potential, an operation voltage of the dynamic latch circuit becomes half of the write voltage when starting the sensing operation. In order to reduce the write voltage in such a configuration, if the write voltage is set to, for example, 0.5V, the operation voltage of the dynamic latch circuit becomes 0.25V so as to be approximately equal to a threshold voltage of the MOS transistor. Thus, there arises a problem that it is difficult for the sense amplifier to normally operate, or a problem that operating speed of the sense amplifier increases even if it operates.

SUMMARY

The present invention seeks to solve one or more of the above problems, or to improve upon those problems at least in part.

One of aspects of the invention is a semiconductor device comprising: a memory cell storing data; a bit line connected to the memory cell; a sense amplifier operating between a first voltage and a second voltage higher than the first voltage, the sense amplifier receiving a signal voltage read out to the bit line in response to the data of the memory cell at a sense node connected to a gate of a transistor and amplifying a voltage at the sense node; a transfer control circuit including a transfer transistor controlling an electrical connection between the bit line and the sense node in response to a transfer control voltage inputted to a gate of the transfer transistor; and a write circuit writing data into the memory cell through the bit line based on the first voltage and a third voltage corresponding to data of high-level of the memory cell. In the semiconductor device of the invention, the third voltage is set to a voltage lower than the second voltage and higher than the transfer control voltage, and the sense node is set to a voltage higher than the transfer control voltage in an initial period of a read operation before the data of the memory cell is read out to the bit line.

Further, one of the aspects of the invention is a semiconductor memory device comprising: a memory cell storing data in response to stored charge; a bit line connected to the memory cell; a transfer control circuit controlling an electrical connection between the bit line and a sense node based on a relation between a reference voltage set for the bit line before the memory cell is connected to the bit line and a voltage of the bit line shifted from the reference voltage when the memory cell is connected to the bit line; a sense amplifier having a single ended configuration in which the sense node is connected to a gate of a transistor, the sense amplifier amplifying a signal voltage at the sense node; and a write circuit writing data into the memory cell through the bit line based on a write voltage corresponding to data of high-level of the memory cell. In the semiconductor device of the invention, the write voltage is set lower than an operation voltage of the sense amplifier, and the transfer control circuit controls so that the bit line is electrically disconnected from the sense node when the voltage of the bit line shifted from the reference voltage is higher than the reference voltage, and the bit line is electrically connected to the sense node when the voltage of the bit line is lower than the reference voltage, in a state in which a voltage at the sense node is set to the operation voltage of the sense amplifier.

Furthermore, one of the aspects of the invention is a data processing system comprising a semiconductor device of the invention and a controller. The controller is connected to the semiconductor device through a bus and processes data stored in the semiconductor device and controlling an operation of the system as a whole and an operation of the semiconductor device.

According to the present invention, the write voltage for the memory cell can be reduced, excellent operating margin for the sense amplifier and high-speed operation can be obtained, and it is possible to achieve low power consumption and low cost. Detailed effects will be described below.

According to the present invention, since the write voltage (third voltage) for the memory cell is set lower than the operation voltage (second voltage) of the sense amplifier and higher than the transfer control voltage of the transfer control circuit, the signal voltage of the bit line obtained by reading the high-level data of the memory cell can be transformed into the operation voltage of the sense node and transferred via the sense node. Accordingly, the operating speed and the sense margin can be ensured in the sense amplifier so that excellent sensing operation is ensured therein, and an effect of reducing the write voltage for the memory cell can be obtained.

According to the present invention, since the voltage applied to the capacitor of the memory cell can be reduced by reducing the write voltage, the electric field strength condition of a capacitor dielectric film is maintained, reliability of the capacitor dielectric film is maintained and film thickness thereof can be reduced without an increase in the leak current at the data storage node of the memory cell. In this case, since capacitance of the capacitor increases, stored charge amount (Q=CV) of the capacitor can be approximately equal to storage charge amount Q' in the conventional configuration (in which the write voltage is equal to the operation voltage of the sense amplifier).

Further, the above structure of the memory cell allows the potential at the P-N junction portion formed between the data storage node of the memory cell and a silicon substrate node to be reduced, the leak current from the memory cell (storage node) to the substrate can be reduced, and data retention time of the memory cell can be prolonged so that an effect of stabilizing the operation of the semiconductor device can be obtained. Further, if the data retention time is prolonged, frequency of refreshing (the number of refreshes per predetermined time) can be reduced, and an effect of reducing consumption current necessary for the refresh operation can be obtained. Further, by reducing the write voltage, the potential of the data storage node corresponding to the high-level data of the memory cell decreases, the boost voltage applied to the gate of the access transistor connected between the capacitor of the memory cell and the bit line when driving the word line. Therefore, in addition to effectiveness of lower power consumption of the semiconductor device, an area for arranging a boost power supply circuit can be reduced, and it is possible to achieve reductions in chip area and cost.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
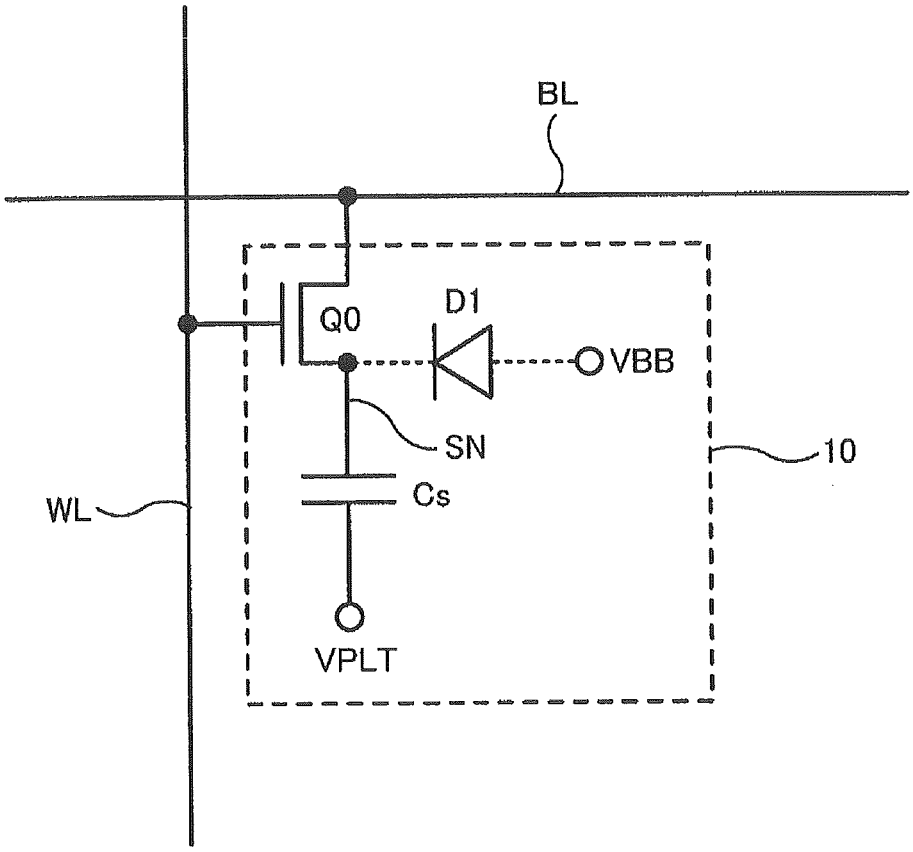
FIG. 1 is an equivalent circuit of a memory cell included in a DRAM of an embodiment.

Typical examples of a technical idea solving the problems of the present invention will be shown. However, it goes without saying that the present invention is not limited to the examples of the technical idea and consists in the scope of the claimed invention.

The technical idea of the present invention is that data (charge amount) of a memory cell (a capacitor) is read out to a bit line, a sense amplifier in which the bit line is connected to a gate of a transistor is configured to amplify the potential of the bit line to an operation voltage of the sense amplifier, a third voltage (VARY) corresponding to high-level data (generally corresponding to "1") of the memory cell is set lower than a second voltage (VDD) as the operation voltage of the sense amplifier, while the third voltage (VARY) is set higher than a transfer control voltage (VTG) applied to a gate of a transfer transistor (transfer gate) of a transfer control circuit placed between the bit line and the gate of the transistor as a signal input terminal of the sense amplifier, and before a read operation of the data of the memory cell via the bit line, a sense node (the signal input terminal of the sense amplifier) of the sense amplifier is set to a voltage higher than the transfer control voltage (VTG).

By setting the third voltage (operating voltage of a write amplifier) to be lower than the second voltage (operating voltage of the sense amplifier), charge leak from a P-N junction portion formed between a drain of a select transistor (access transistor connected between the bit line and a capacitor) of the memory cell and a silicon substrate (or well) is suppressed. Further, by setting the third voltage higher than the transfer control voltage (gate voltage of the transfer transistor), when the potential of the bit line increases (shifted) from a predetermined voltage (a reference voltage) based on high-level data ("1") of the memory cell, electrical connection of the transfer transistor becomes a non-conductive state due to characteristics of a gate-source voltage thereof, and when the potential of the bit line decreases (shifted) from the predetermined voltage based on low-level data ("0") of the memory cell, the electrical connection of the transfer transistor becomes a conductive state due to characteristics thereof. When the transfer transistor becomes conductive, charge at the sense node (signal input terminal of the sense amplifier) can be rapidly discharged. In addition, by setting the sense node of the sense amplifier to a voltage higher than the transfer control voltage, the sense amplifier directly senses and amplifiers the potential of the bit line that has been shifted via "the transfer transistor being conductive by the potential of the bit line shifted downward corresponding to the low-level data of the memory cell". On the other hand, the potential of the bit line is not directly inputted to the input terminal of the sense amplifier via "the transfer transistor being non-conductive by the potential of the bit line shifted upward corresponding to the high-level data of the memory cell". In this case, the sense amplifier senses and amplifies the potential of the sense node that is set to the voltage higher than the transfer control voltage (VTG). In other words, the sense amplifier performs sensing based on the potential of the bit line that is shifted downward when reading the low-level ("0") of the memory cell and performs sensing based on the potential of the sense node that is previously set to a potential higher than the write voltage instead of the potential of the bit line shifted upward when reading the high-level ("1") of the memory cell. Thus, the sense amplifier operates at an extremely high speed in the read operation of the high-level data and operates at a high speed by rapidly discharging the charge at the sense node in the read operation of the low-level data. According to the conventional technical idea, the potential of the bit line shifted by both high-level and low-level data is sensed. In contrast, according to the technical idea of the present invention, the potential of the bit line shifted by only the low-level data is sensed. That is, the sensing can be performed by a voltage difference between the potential of the bit line corresponding to the low-level data and the potential of the sense node that is previously set to the voltage higher than the write voltage corresponding to the high-level data. This voltage difference is much higher than a voltage difference corresponding to the respective low-level and high-level data in the conventional manner, and advantages of high sensing sensitivity and high sensing speed can be obtained. Based on the above described mechanism, the semiconductor device of the present invention is capable of reducing the write voltage for the memory cell and suppressing leak current by reducing the potential of the P-N junction portion formed between the drain of the select transistor of the memory cell and a silicon substrate.

The following U.S. patent applications are hereby incorporated by reference in its entirety as though fully and completely set forth herein.

(1) U.S. patent application Ser. No. 12/461,858 filed Aug. 26, 2009 entitled "Sense Amplifier Circuit And Semiconductor Memory Device", whose inventor is Kazuhiko Kajigaya.

(2) U.S. patent application Ser. No. 12/382,494 filed Mar. 17, 2009 entitled "Semiconductor Device Having Single-Ended Sensing Amplifier", whose inventors are Kazuhiko Kajigaya and Soichiro Yoshida.

(3) U.S. patent application Ser. No. 12/416,432 filed Apr. 1, 2009 entitled "Semiconductor Memory Device", whose inventors are Kazuhiko Kajigaya, Soichiro Yoshida, Tomonori Sekiguchi, Riichiro Takemura and Yasutoshi Yamada.

(4) U.S. patent application Ser. No. 12/382,493 filed Mar. 17, 2009 entitled "Semiconductor Device Having Single-Ended Sensing Amplifier", whose inventor is Kazuhiko Kajigaya.

(5) U.S. patent application Ser. No. 12/461, 859 filed Aug. 26, 2009 entitled "Sense Amplifier Circuit And Semiconductor Memory Device", whose inventor is Kazuhiko Kajigaya The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, the present invention is applied to a DRAM (Dynamic Random Access Memory) as an example of a semiconductor device. Basic configuration and operation of the DRAM of the embodiments will be explained first with reference to FIGS. 1 to 5.

FIG. 1 shows an equivalent circuit of a memory cell 10 included in the DRAM of an embodiment. The memory cell 10 shown in FIG. 1 is composed of an NMOS type select transistor Q0 and a capacitor Cs which are connected in series. The select transistor Q0 has a gate connected to a word line WL, a source connected to a bit line BL, and a drain connected to one electrode of the capacitor Cs. Here, there is a data storage node SN at which the select transistor Q0 and the capacitor Cs are connected to each other. A write voltage VARY is supplied to the data storage node SN when writing high-level data into the memory cell 10. A diode D1 obtained from the structure of the semiconductor memory device is formed between the data storage node SN and a substrate voltage VBB, which will be described in detail later. A cell plate voltage VPLT is applied to the other electrode of the capacitor Cs. The cell plate voltage VPLT is generally set to a voltage value which is half the write voltage VARY. Hereinafter, a capacitance of the capacitor Cs will be simply denoted as "capacitance Cs".

Figure 2:
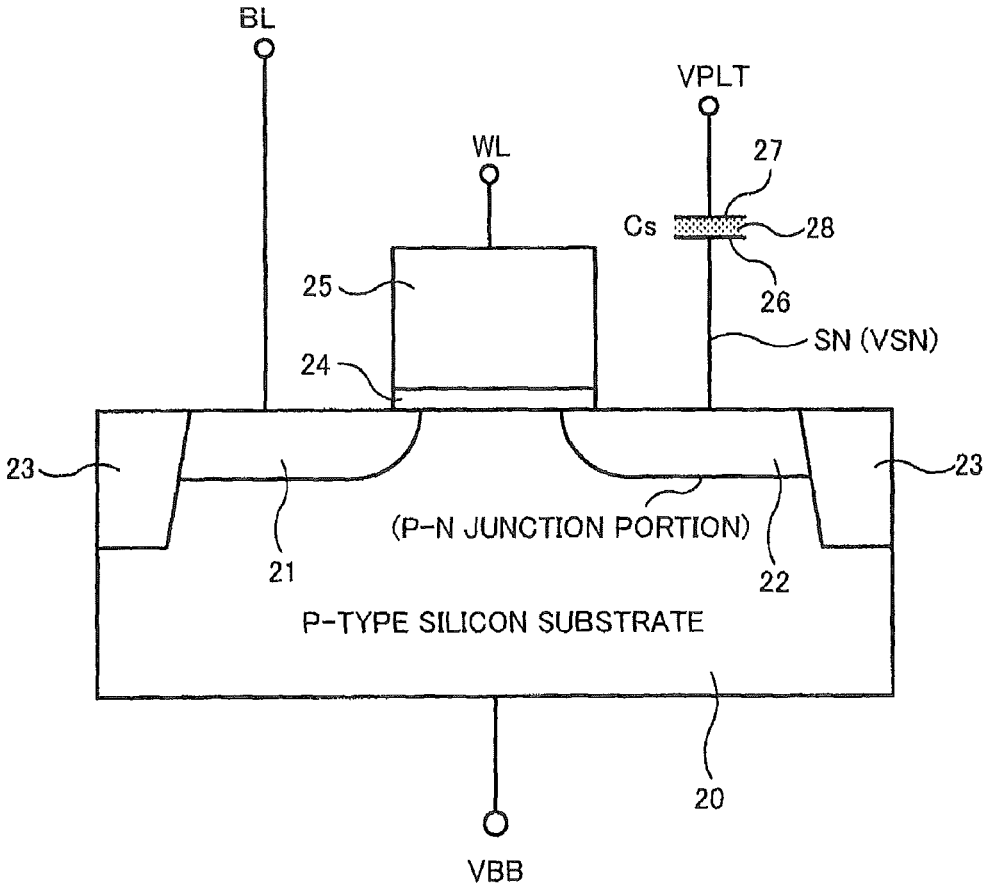
FIG. 2 is a cross-sectional structure diagram of a select transistor in the equivalent circuit of FIG. 1.

FIG. 2 shows a cross-sectional structure diagram of the select transistor Q0 in the equivalent circuit of FIG. 1. In FIG. 2, two N-type impurity layers 21 and 22 are formed in upper regions of a P-type silicon substrate 20, and an element isolation insulating film 23 is formed in a region surrounding the impurity layers 21 and 22. One N-type impurity layer 21 is a source of the select transistor Q0 and is connected to the upper bit line BL. The other N-type impurity layer 22 is a drain of the select transistor Q0 and is connected to a storage electrode 26 corresponding to one electrode of the capacitor Cs via the data storage node SN. A plate electrode 27 corresponding to the other electrode of the capacitor Cs is opposed to the storage electrode 26 via a capacitor dielectric film 28 and is connected to an upper wiring of the cell plate voltage VPLT. Further, a gate electrode 25 (gate of the select transistor Q0) connected to the word line WL is formed over a channel region between the N-type impurity layers 21 and 22 via a gate dielectric film 24.

In FIG. 2, there is formed a P-N junction portion between the P-type silicon substrate 20 and the N-type impurity layer 22 as the drain and operates as the diode D1 of FIG. 1. In addition, the P-type silicon substrate 20 can be replaced with a structure where a P-well is formed on an N-TYPE silicon substrate. The diode D1 receives the substrate voltage VBB at the P-type silicon substrate 20 corresponding to a cathode and receives a voltage VSN of the data storage node SN at the N-type impurity layer 22 corresponding to an anode, and therefore the operation of the diode D1 depends on the substrate voltage VBB and the voltage VSN.

Figure 3A:
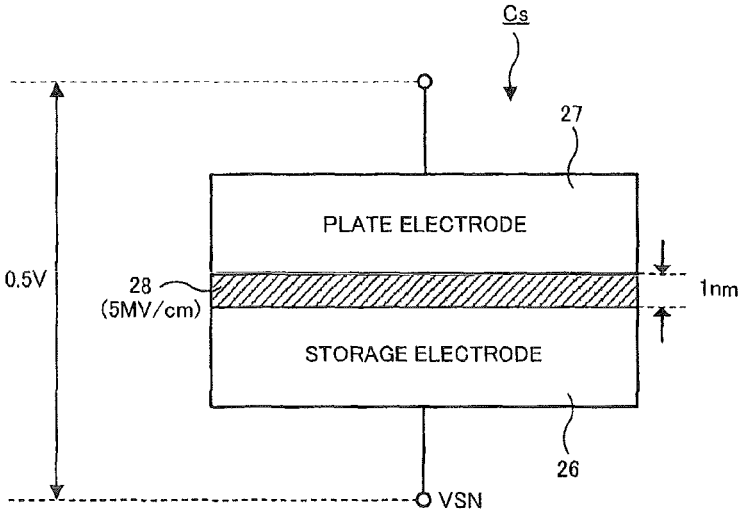
FIGS. 3A and 3B are diagrams showing a relation between stored charge amount at a storage node and design conditions of a capacitor in the memory cell.
Figure 3B:
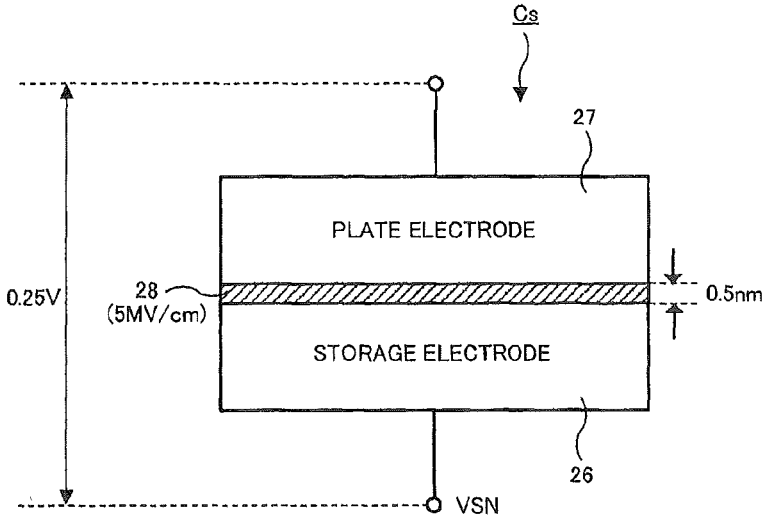

Next, a relation between stored charge amount Qs at the storage node SN and design conditions of the capacitor Cs in the memory cell 10 will be described with reference to FIGS. 3A and 3B. FIGS. 3A and 3B schematically show relations between two conditions of the capacitor Cs, each of which specifies a dielectric film thickness and a tolerable voltage, and a corresponding stored charge amount Qs. Generally, the dielectric tolerable voltage is defined for the capacitor Cs, and an electric field strength needs to be set below a predetermined level in order to obtain reliability by suppressing an increase in leak current of the dielectric film. This maximum permissible electric field strength is determined not to be greater than, for example, 5 MV/cm, which depends on material of the dielectric film, and this condition is premised in FIGS. 3A and 3B. In addition, it is assumed that the respective capacitors Cs of FIGS. 3A and 3B have a common area and a common relative dielectric constant.

In FIG. 3A, the write voltage VARY is set to 1V, which is equal to a supply voltage VDD of the semiconductor memory device (VARY=VDD=1V). At this point, by setting the dielectric film thickness to 1 nm, a voltage of the capacitor dielectric film 28 between the storage electrode 26 and the plate electrode 27 becomes 0.5V, and therefore the above electric field of 5 MV/cm which is the maximum permissible electric field strength is applied to the dielectric film. Under this condition, the stored charge amount Qs becomes 5 fC when assuming the capacitance Cs of 10 fF.

Meanwhile, in FIG. 3B, the write voltage VARY is set to 0.5V. At this point, a voltage of the capacitor dielectric film 28 between the storage electrode 26 and the plate electrode 27 becomes 0.25V, and when the maximum permissible electric field strength capable of being applied to the dielectric film is assumed to be 5 MV/cm as mentioned above, the dielectric film thickness can be reduced to 0.5 nm which is half that in FIG. 3A. Under this condition, since the capacitors Cs of FIGS. 3A and 3B have the common area and the common relative dielectric constant as described above, the capacitance Cs increases to 20 fF so that the stored charge amount Qs becomes 5 fC. That is, under the condition of FIG. 3B, the same stored charge amount Qs as FIG. 3A can be obtained. As understood from FIGS, 3A and 3B, by reducing the write voltage VARY, it is possible to reduce the film thickness of the capacitor dielectric film 28 necessary for obtaining a given stored charge amount Qs without impairing reliability.

Figure 4:
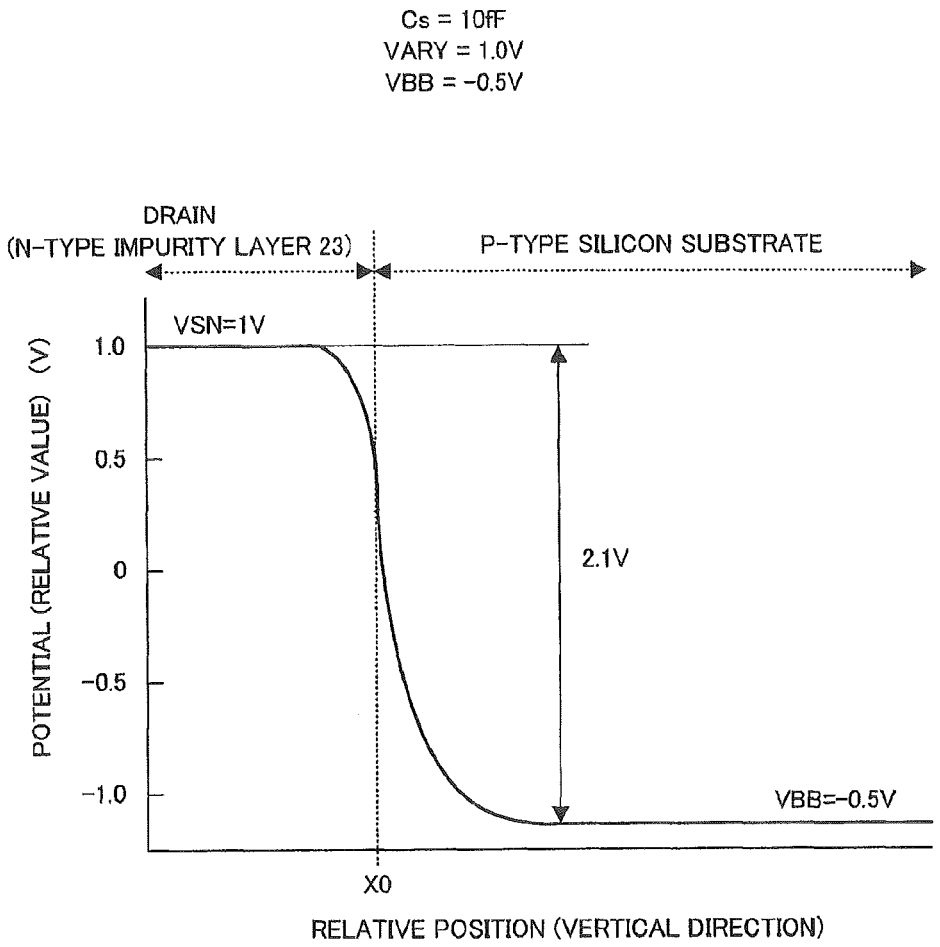
FIG. 4 is a diagram explaining potentials in a region where a diode is formed in the structure of FIG. 2 when Cs=10 fF and VARY=1V are set corresponding to the condition of FIG. 3A.
Figure 5:
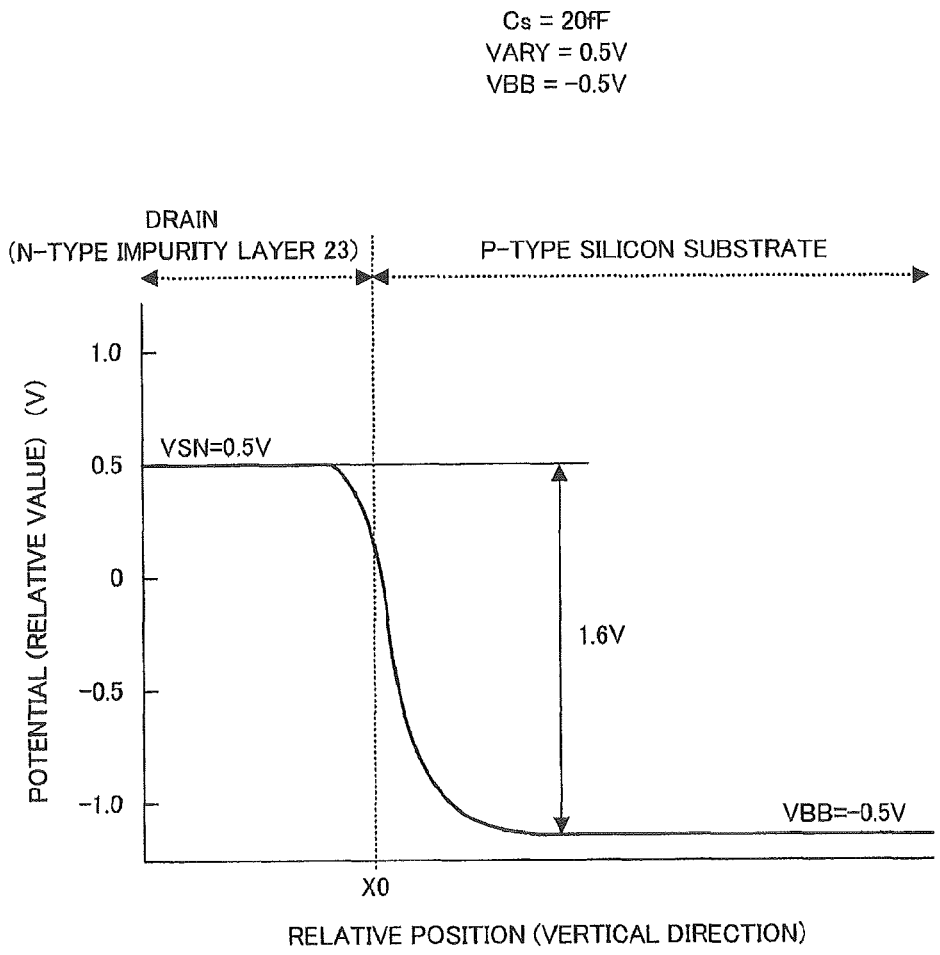
FIG. 5 is a diagram explaining potentials in a region where the diode is formed in the structure of FIG. 2 when Cs=20 fF and VARY=0.5V are set corresponding to the condition of FIG. 3B.

Next, potentials in the region where the diode D1 is formed in the structure of FIG. 2 will be described with reference to FIGS. 4 and 5. In FIGS. 4 and 5, relative positions along a vertical direction are shown by a horizontal axis and potentials applied to the P-N junction portion are shown by a vertical axis in relative values, respectively, in the region from the data storage node SN to the P-type silicon substrate 20 through the drain in the cross-sectional structure of FIG. 2. A position X0 along the horizontal axis is a position of the P-N junction portion, where the position shifts upward in the N-type impurity layer 22 of FIG. 2 when the relative position becomes smaller than the position X0, and the position shifts downward in the P-type silicon substrate 20 of FIG. 2 when the relative position becomes larger than the position X0. Here, the substrate voltage VBB applied to the P-type silicon substrate 20 is assumed to be −0.5V.

FIG. 4 represents the potential corresponding to the condition of FIG. 3A when Cs=10 fF and VARY=1V are set. In this case, the voltage VSN at the data storage node SN is 1V when high-level data is written into the memory cell 10. Thus, in consideration of VBB=−0.5V, when a built-in potential of the P-N junction portion is 0.6V, for example, a potential of 2.1V (relative value) is applied to the P-N junction portion, as shown in FIG. 4. Here, the built-in potential means a potential generated by a depletion layer which is formed at the P-N junction portion in a zero bias state.

Meanwhile, FIG. 5 represents the potential corresponding to the condition of FIG. 3B when Cs=20 fF and VARY=0.5V are set. In this case, the voltage VSN at the data storage node SN is 0.5V when high-level data is written into the memory cell 10. Thus, in consideration of VBB=−0.5V, when the above built-in potential of the P-N junction portion is 0.6V as described above, a potential of 1.6V (relative value) is applied to the P-N junction portion, as shown in FIG. 5.

Figure 6:
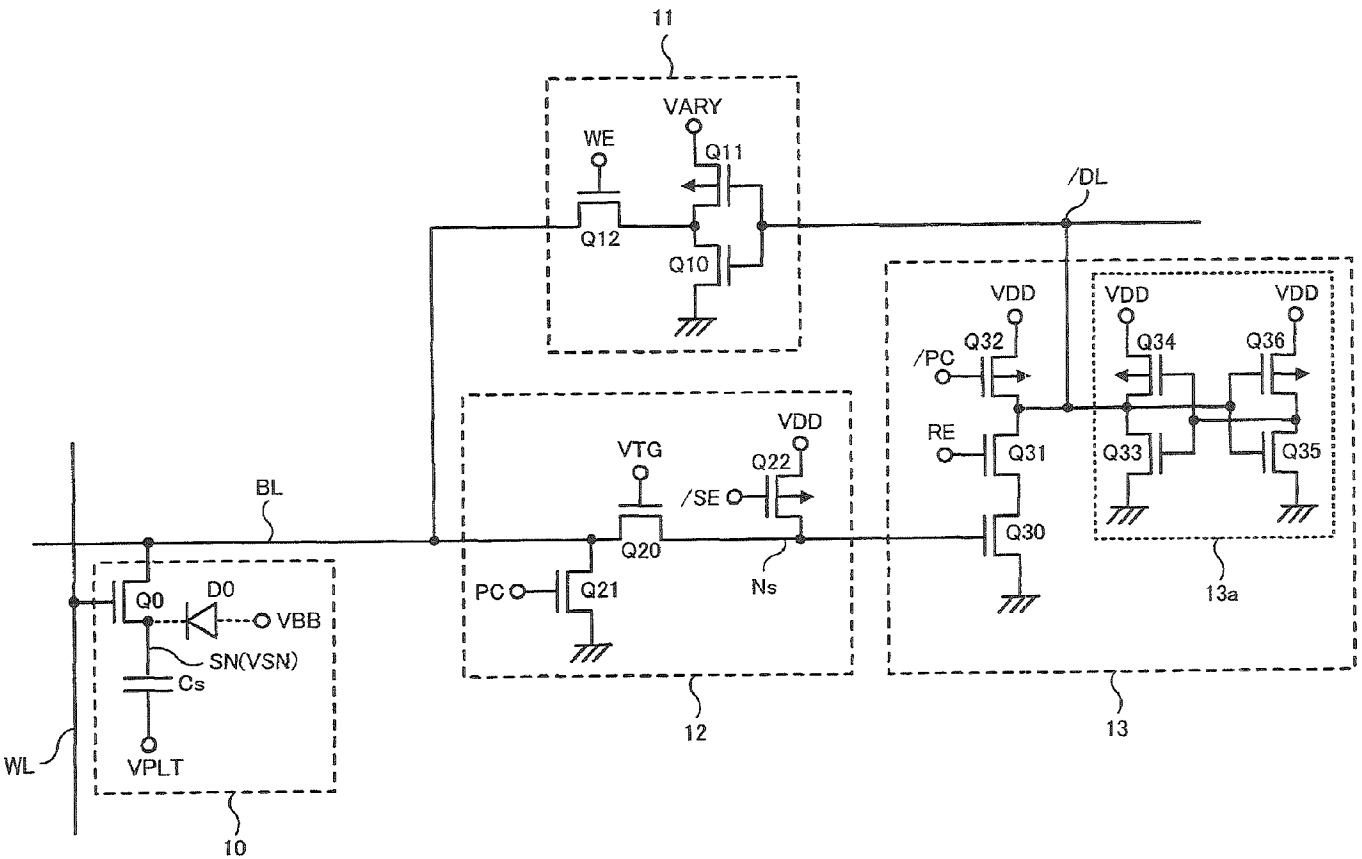
FIG. 6 is a diagram showing an example of a circuit configuration of a principal part in the DRAM of the embodiment.

Next, specific circuit configuration and operation of the DRAM of the embodiment will be described with reference to FIGS. 6 to 8. FIG. 6 shows an example of a circuit configuration of a principal part in the DRAM of the embodiment. In FIG. 6, there are shown a write circuit 11, a charge transfer control circuit 12 and a sense amplifier 13, in addition to the memory cell 10 connected to the word line WL and the bit line BL. The memory cell 10 is configured in the same manner as in FIG. 1, so description thereof will be omitted.

The write circuit 11 includes NMOS type transistors Q10 and Q12 and a PMOS-TYPE transistor Q11. A pair of transistors Q10 and Q11 form an inverter, and gates of the transistor Q10 and Q11 are connected to an input/output node /DL. The transistor Q12 is connected between an output node of the inverter and the bit line BL. A control signal WE is applied to the gate of the transistor Q12, and the control signal WE becomes high-level so that the transistor Q12 turns on when the memory cell 10 is in a write operation or a refresh operation. Thereby, a write signal inputted via the input/output node /DL in the write operation is inverted by the inverter and is written into the memory cell 10 by driving the bit line BL via the transistor Q12. Further, in the refresh operation, an output signal of the sense amplifier 13 is written into the memory cell 10 by driving the bit line BL through the same path.

The inverter of the write circuit 11 is driven by the write voltage VARY, which is lower than the supply voltage VDD as an operation voltage of the sense amplifier 13, and a ground potential VSS, as shown in FIG. 6. For example, VARY=0.5V is set for VDD=1V. Therefore, in the write operation of the high-level data, the write voltage VARY is written into the memory cell 10, and in the write operation of the low-level data, the ground potential VSS is written into the memory cell 10. An input signal of the inverter of the write circuit 11 has an amplitude equal to the supply voltage VDD, and the write voltage VARY is lower than the supply voltage VDD. Therefore, this inverter has a function to convert the signal amplitude from the supply voltage VDD to the write voltage VARY. Accordingly, the driving voltage of the word line WL can be reduced by reducing the write voltage VARY by the write circuit 11.

The charge transfer control circuit 12 (the transfer control circuit of the invention) includes NMOS type transistors Q20 and Q21 and a PMOS-TYPE transistor Q22. The transistor Q20 functions as a charge transfer gate (the transfer transistor of the invention) and controls the connection between the bit line BL and a sense node Ns (the signal input terminal of the sense amplifier) in response to a transfer control voltage VTG applied to the gate. The transistor Q21 for bit line precharge is connected between the bit line BL and the ground potential VSS and precharges the bit line BL in response to a precharge control signal PC applied to the gate. The transistor Q22 for setting the potential of the sense node Ns is connected between the sense node Ns and the supply voltage VDD, sets the potential of the sense node Ns in response to a voltage setting signal /SE applied to the gate and supplies the voltage to the bit line BL via the transistor Q20. Although, the source of the transistor Q22 is connected to the supply voltage VDD in the example of FIG. 6, the source of the transistor Q22 may be connected to a voltage higher than the supply voltage VDD.

The sense amplifier 13 includes NMOS type transistors Q30, Q31, Q33 and Q35 and PMOS-TYPE transistors Q32, Q34 and Q36. The transistor Q30 for sense detection, the transistor Q31 for controlling a sensing period and the transistor Q32 for precharging the input/output node /DL are connected in series between the supply voltage VDD and the ground potential VSS. Further, the transistors Q33, Q34, Q35 and Q36 included in the sense amplifier 13 form a sense amplifier input/output latch 13a. In addition, the operation voltage of the sense amplifier 13 is the supply voltage VDD.

The gate of the transistor Q30 is connected to the sense node Ns, and the transistor Q30 turns on when the potential of the sense node Ns is higher than the threshold voltage of the transistor Q30. A sensing period control signal RE is applied to the gate of the transistor Q31, and the transistor Q31 turns on during a period when the sensing period control signal RE is high. At this point, if the transistor Q30 is in "on" state, charge is drawn from the input/output node /DL to the ground potential VSS through the transistors Q31 and Q30, and if the transistor Q31 is in "off" state, the input/output node /DL is maintained in a state of being precharged to the supply voltage VDD. A precharge control signal /PC is applied to the gate of the transistor Q32, and the input/output node /DL is precharged to the supply voltage VDD via the transistor Q32 during a period when the precharge control signal /PC is low. In the sense amplifier input/output latch 13a, the input/output node /DL is connected to common drains of a pair of transistors Q33 and Q34 and common gates of a pair of transistors Q35 and Q36, respectively. The sense amplifier input/output latch 13a operates so as to maintain the level (state) of the input/output node /DL.

Figure 7:
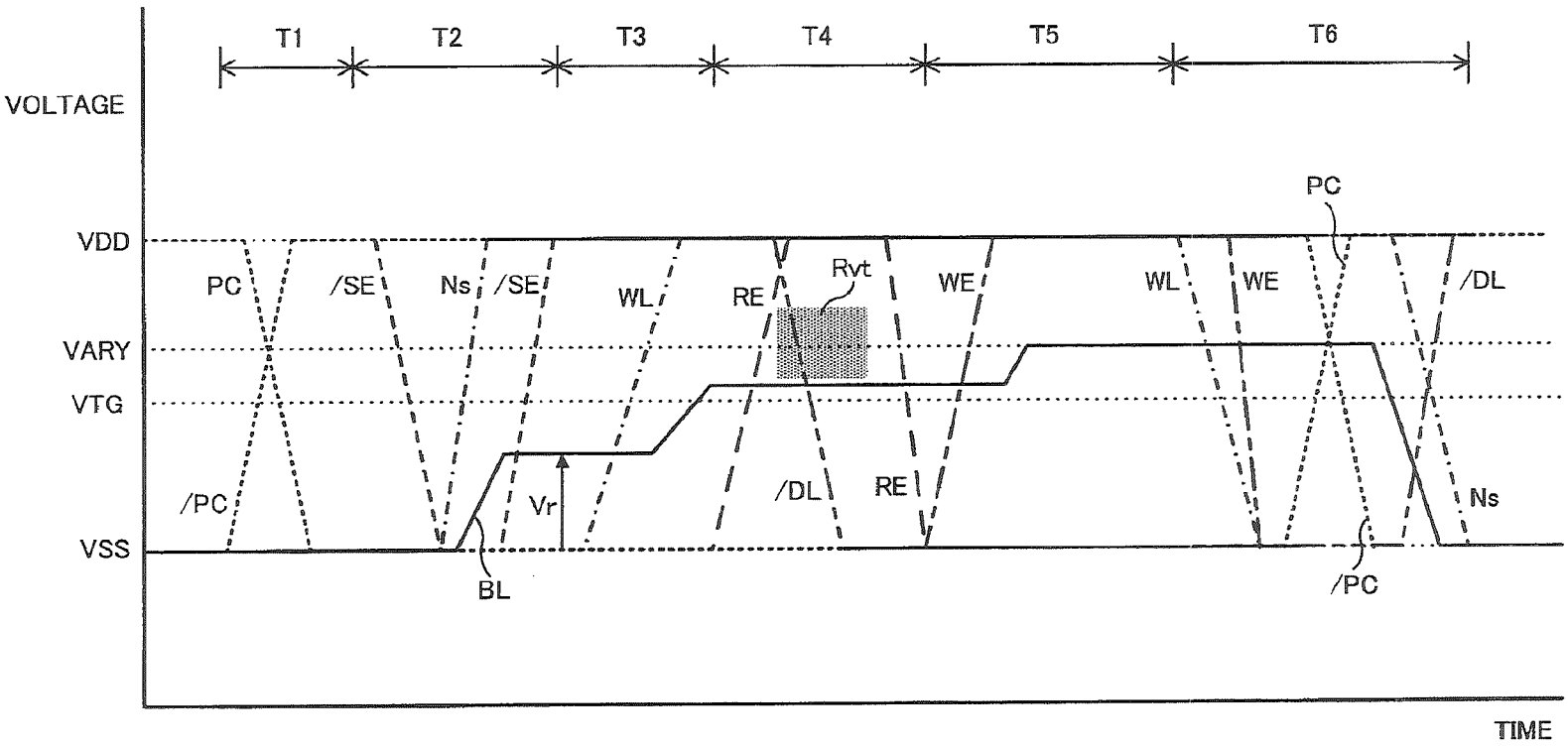
FIG. 7 is a diagram showing operation waveforms when reading high-level data from the memory cell in a read operation of the DRAM of the embodiment.

FIG. 7 shows operation waveforms when reading high-level data from the memory cell 10 in a read operation of the DRAM of the embodiment. As shown in the upper part of FIG. 7, the entire read operation is divided into six periods (T1 to T7). Specifically, a precharge completion period T1, a voltage setting period T2, a stored charge read period T3, a sensing period T4, a refresh period (restore period) T5, and a precharge start period T6 are shown respectively.

In the precharge completion period T1, the precharge control signal PC is changed from high to low, and the precharge control signal /PC is changed from low to high. Thereby, the bit line BL which has been precharged to the ground potential VSS becomes floating, and the input/output node /DL of FIG. 6 which has been precharged to the supply voltage VDD is latched by the sense amplifier input/output latch 13a.

Subsequently, in the voltage setting period T2, the voltage setting signal /SE is changed from high to low, and the sense node Ns is driven to the supply voltage VDD through the transistor Q22. At this point, the bit line BL is driven to a reference voltage Vr shown in FIG. 7 through the transistor Q20. The reference voltage Vr has a voltage value lower than the transfer control voltage VTG by a threshold voltage Vt20 of the transistor Q20. Thereafter, the voltage setting signal /SE returns to high so that the transistor Q22 turns off, and the sense node Ns which has been precharged to the supply voltage VDD becomes floating. Further, the bit line BL in a state of maintaining the reference voltage Vr becomes floating. Here, if the data storage node SN of the memory cell 10 is higher than the reference voltage Vr, the reading of the high-level data is detected, and if the data storage node SN of the memory cell 10 is lower than the reference voltage Vr, the reading of the low-level data is detected.

Subsequently, in the stored charge read period T3, the word line WL is driven to the supply voltage VDD, and charge stored in the memory cell 10 corresponding to the high-level data is read out to the bit line BL. As shown in FIG. 7, the potential of the bit line BL shifts upward from the reference voltage Vr and slightly exceeds the transfer control voltage VTG. As a result, since the transistor Q20 turns off, the potential of the sense node Ns maintains the supply voltage VDD.

Subsequently, in the sensing period T4, the sensing period control signal RE is changed from low to high and maintains high for a certain period of time. Here, FIG. 7 shows a set range Rvt which is allowable in consideration of fluctuation in the threshold voltage Vt30 of the transistor Q30. It is understood that the set range Rvt is set higher than the reference voltage Vr and lower than the supply voltage VDD. Therefore, since the potential of the sense node Ns maintains the supply voltage VDD and the transistor Q30 is on during the sensing period T4, the input/output node /DL is drawn from the supply voltage VDD to the ground potential VSS through the transistor Q30. Thereafter, the potential of the input/output node /DL is latched by the sense amplifier input/output latch 13a when the sensing period control signal RE returns to low.

Subsequently, in the refresh period (restore period) T5, the control signal WE is changed from low to high, and the write circuit 11 inverts the potential of the input/output node /DL so as to drive the bit line BL to the write voltage VARY. Thereby, the high-level data is restored into the memory cell 10 in response to the write voltage VARY maintained by the bit line BL.

Subsequently, in the precharge start period T6, the word line WL returns to low, and the select transistor Q0 turns off so that the memory cell 10 is disconnected from the bit line BL. Then, the precharge control signal PC is changed from low to high and the precharge control signal /PC is changed from high to low. Thereby, the bit line BL and the sense node Ns are precharged to the ground potential VSS, the input/output node /DL is precharged to the supply voltage VDD, and the read operation of FIG. 7 completes.

Figure 8:
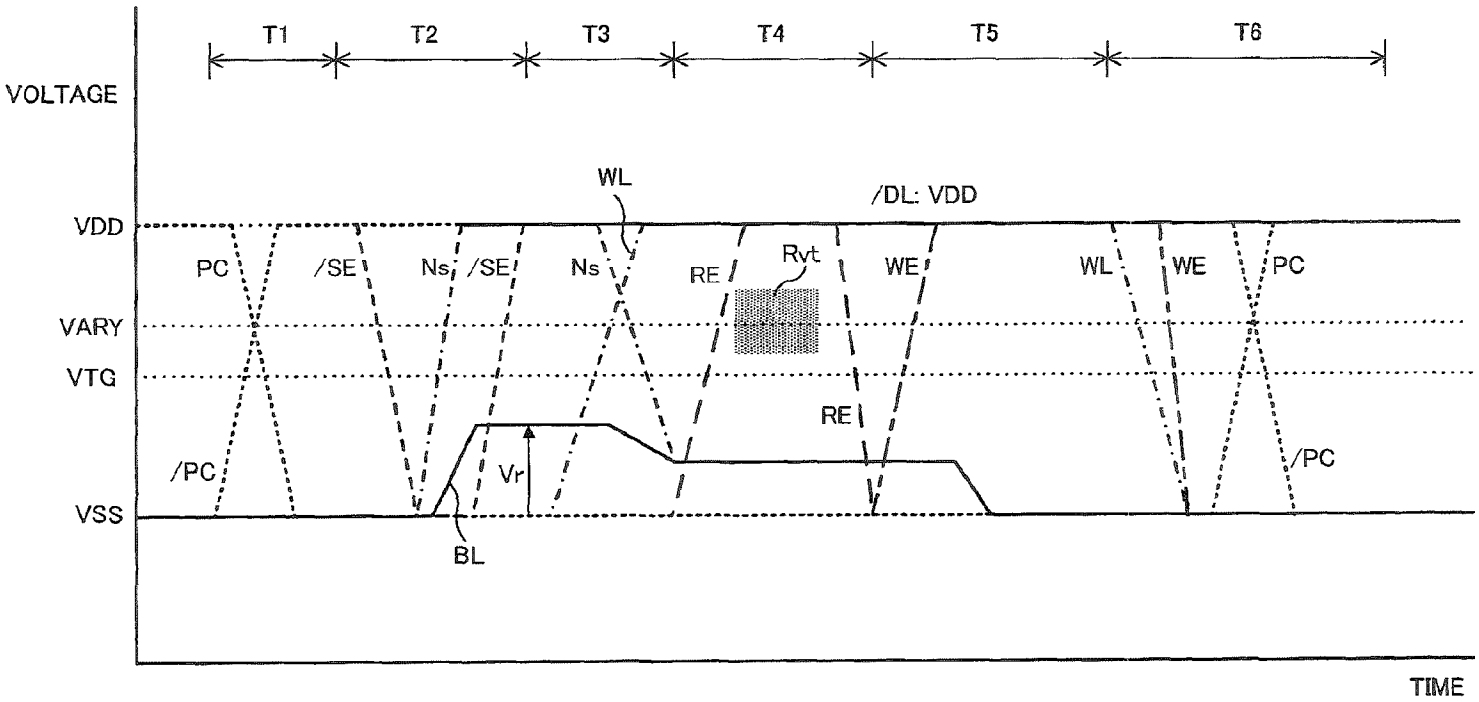
FIG. 8 is a diagram showing operation waveforms when reading low-level data from the memory cell in the read operation of the DRAM of the embodiment.

FIG. 8 shows operation waveforms when reading low-level data from the memory cell 10 in the read operation of the DRAM. Meaning of the periods (T1 to T6) shown in the upper part of FIG. 8 is the same as in FIG. 7. Further, operation waveforms in the precharge completion period T1 and in the voltage setting period T2 in FIG. 8 are common to those in FIG. 7, so description thereof will be omitted.

In the stored charge read period T3, the word line WL is driven to the supply voltage VDD, and charge stored in the memory cell 10 corresponding to the low-level data is read out to the bit line BL. As shown in FIG. 8, the potential of the bit line BL shifts downward from the reference voltage Vr. As a result, since the transistor Q20 turns on, charge is drawn from the sense node Ns to the bit line BL. Finally, potentials of both the bit line BL and the sense node Ns converge to a predetermined voltage lower than the reference voltage Vr.

Subsequently, in the sensing period T4, the sensing period control signal RE is changed from low to high, and maintains high for a certain period of time. FIG. 8 shows the set range Rvt in the same manner as in FIG. 7. Since the transistor Q30 turns off, which is apparent from the relation between the potential of the sense node Ns and the set range Rvt, the input/output node /DL maintains the supply voltage VDD during the sensing period T4. Thereafter, the potential of the input/output node /DL is latched by the sense amplifier input/output latch 13a when the sensing period control signal RE returns to low.

Subsequently, in the refresh period (restore period) T5, the control signal WE is changed from low to high, and the write circuit 11 inverts the potential of the input/output node /DL so as to drive the bit line BL to the ground potential VSS. Thereby, the low-level data is restored into the memory cell 10 in response to the potential of the bit line BL. Subsequently, after the precharge start period T6 similarly as in FIG. 7, the read operation of FIG. 8 completes.

Although FIGS. 7 and 8 show a case in which the potential of the sense node Ns is set to the supply voltage VDD, the potential of the sense node Ns may be set higher than the supply voltage VDD. Setting in this manner allows the gate voltage of the transistor Q30 to be higher than the supply voltage VDD when reading the high-level data from the memory cell 10. Therefore, time for drawing charge from the above input/output node /DL can be shortened, and the sense amplifier 13 can operate at higher speed.

Although the read operation of the DRAM of the embodiment has been described in the foregoing, a write operation (not shown) may be performed by changing the operation in the refresh period T5 of FIGS. 7 and 8. That is, in the refresh period T5, the input/output node /DL can be driven to a signal voltage inverted from external write data, and the signal voltage can be further inverted by the write circuit 11 so that write operation for the memory cell 10 can be performed.

Here, the supply voltage VDD in the charge transfer control circuit 12 (source of the transistor Q22) and the supply voltage VDD in the sense amplifier 13 (source of the transistor Q32) can be set to different voltages. The supply voltage VDD supplied to the source of the transistor Q22 is determined mainly based on sensitivity design of the transistor Q30 in the sense amplifier 13. The supply voltage VDD supplied to the source of the transistor Q32 is determined mainly based on amplitude design in the sense amplifier 13. The supply voltage VDD supplied from the source of the transistor Q22 to the sense node Ns is closely related to threshold voltage value of the transistor Q20 and to C ratio determined by parasitic capacitance values of the sense node Ns and the bit line BL. The parasitic capacitance value of the sense node Ns is desired to be extremely small in order to improve sensing speed (response speed corresponding to potential transition of the bit line). For example, the above C ratio is desired to be larger than 10. On the other hand, the supply voltage VDD supplied to the source of the transistor Q32 is also used to drive the input/output node /DL and may be lower than the supply voltage VDD supplied to the source of the transistor Q22 so as not to cause an increase in charging/discharging current at the input/output node /DL. Further, the supply voltage VDD supplied to the sense amplifier input/output latch 13a (sources of the transistors Q34 and Q36) is desired to be equal to the supply voltage VDD supplied to the source of the transistor Q32. This is for the purpose of avoiding that a so-called DC current is generated in the sense amplifier input/output latch 13a. Furthermore, the supply voltage VDD supplied to the sense amplifier input/output latch 13a and the source of the transistor Q32 may be lower than the supply voltage VDD supplied to the source of the transistor Q22. This is for the purpose of avoiding a decrease in inverting speed of the sense amplifier input/output latch 13a, which is caused when the higher supply voltage VDD supplied to the sense amplifier input/output latch 13a and to the source of the transistor Q32 is set to a high voltage. Thus, the supply voltage VDD supplied to the source of the transistor Q22 may be higher than the supply voltage VDD supplied to the sense amplifier 13.

Figure 9:
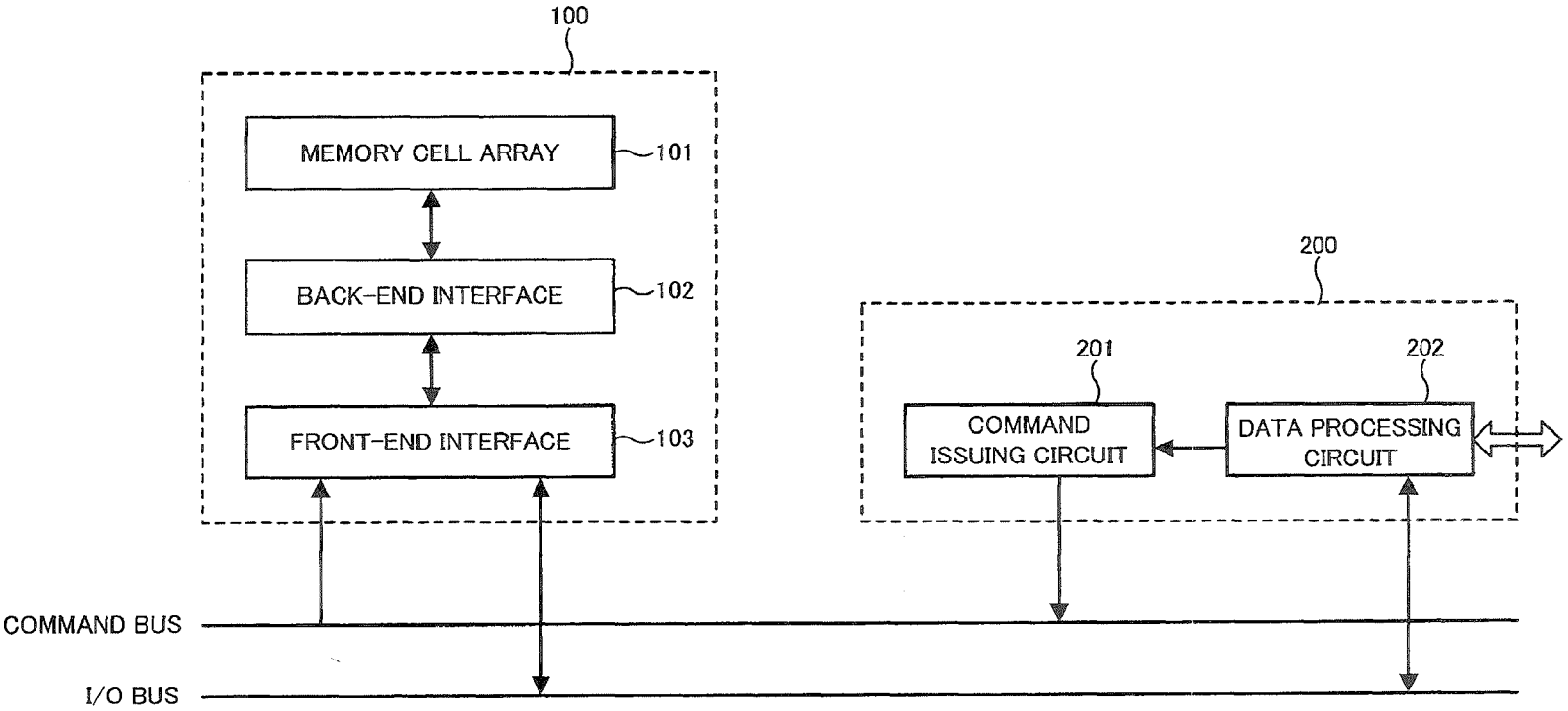
FIG. 9 shows a configuration example of a data processing system comprising a semiconductor device having the configuration described in the embodiment and a controller controlling operation of the semiconductor device.

Next, a case in which the present invention is applied to a system comprising a semiconductor device will be described. FIG. 9 shows a configuration example of a data processing system comprising a semiconductor device 100 having the configuration described in the embodiment and a controller 200 controlling operation of the semiconductor device 100.

The semiconductor device 100 is provided with a memory cell array 101, a back-end interface 102 and a front-end interface 103. A large number of memory cells of the embodiment are arranged in the memory cell array 101. The back-end interface 102 includes circuits of the embodiment such as the write circuit 11, the charge transfer control circuit 12 and the sense amplifier 13. The front-end interface 103 has a function to communicate with the controller 200 through a command bus and an I/O bus. Although FIG. 9 shows one semiconductor device 100, a plurality of semiconductor devices 100 can be provided in the system.

The controller 200 is provided with a command issuing circuit 201 and a data processing circuit 202, and controls operation of the system as a whole and the operation of the semiconductor device 100. The controller 200 is connected with the command bus and the I/O bus, and additionally has an interface for external connection. The command issuing circuit 201 sends commands to the semiconductor device 100 through the command bus. The data processing circuit 202 sends and receives data to and from the semiconductor device 100 through the I/O bus and performs processes required for the controlling. In addition, the semiconductor device of the embodiment may be included in the controller 200 in FIG. 9.

The data processing system of FIG. 9 is, for example, a system implemented in electronics devices such as personal computers, communication electronics devices, mobile electronics devices and other industrial/consumer electronics devices.

In the foregoing, the preferred embodiment of the present invention has been described. However the present invention is not limited to the above embodiment and can variously be modified without departing the essentials of the present invention, and the present invention obviously covers the various modifications. That is, the present invention covers the various modifications which those skilled in the art can carry out in accordance with all disclosures including claims and technical ideas.

For example, although the configuration in which the ground potential VSS is used as the reference voltage has been described in the embodiment, the present invention can be applied to a configuration in which the voltage relation is reversed so as to use the supply voltage VDD as the reference voltage. In this case, N-channel type transistors included in the circuit configuration (FIG. 6) of the embodiment may be replaced with P-channel type transistors or the like.

Further, various circuit configurations can be employed for the write circuit 11, the transfer control circuit 12, the sense amplifier 13 and the like, without being limited to the circuit configurations described in the embodiment.

Further, various cell structures can be employed for the memory cell 10 including the P-N junction portion. A vertical transistor including the P-N junction portion can be employed for the structure of the select transistor Q0 of the memory cell 10.

Further, FETs (Field Effect Transistors) or bipolar transistors can be used as the transistors in the embodiment. Also various FETs other than MOS (Metal Oxide Semiconductor) transistors can be used (for example, Metal-Insulator Semiconductors or Thin Film Transistors), and transistors other than FETs can be used. Further, an N-channel type transistors (NMOS transistors) is a typical example of a first conductive type transistor, and a P-channel type transistor (PMOS transistor) is a typical example of a second conductive type transistor. Furthermore, an N-TYPE semiconductor substrate can be used other than a P-type semiconductor substrate, and also a semiconductor substrate having SOI (Silicon on Insulator) structure or other type semiconductor substrates can be used.

Further, the present invention is not limited to the DRAM as the semiconductor memory device, and can be applied to various semiconductor devices such as a CPU (Central Processing Unit), a MCU (Micro Control Unit), a DSP (Digital Signal Processor), an ASIC (Application Specific Integrated Circuit), an ASSP (Application Specific Standard Product) or the like, all of which includes a memory unit.

The invention claimed is:

1. A semiconductor device comprising:

a memory cell storing data;

a bit line connected to the memory cell;

a sense amplifier operating between a first voltage and a second voltage higher than the first voltage, the sense amplifier receiving a signal voltage read out to the bit line in response to the data of the memory cell at a sense node connected to a gate of a transistor and amplifying a voltage at the sense node;

a transfer control circuit including a transfer transistor controlling an electrical connection between the bit line and the sense node in response to a transfer control voltage inputted to a gate; and a write circuit writing data into the memory cell through the bit line based on the first voltage and a third voltage corresponding to data of high-level of the memory cell, wherein the third voltage is set to a voltage lower than the second voltage and higher than the transfer control voltage, and the sense node is set to a voltage higher than the transfer control voltage in an initial period of a read operation before the data of the memory cell is read out to the bit line.

2. The semiconductor device according to claim 1, wherein a reference voltage of the bit line set in the initial period of the read operation is lower than the transfer control voltage by a threshold voltage of the transfer transistor.

3. The semiconductor device according to claim 2, wherein the memory cell includes a capacitor storing data corresponding to stored charge and a select transistor connected between one electrode of the capacitor and the bit line, the select transistor having a gate connected to a word line.

4. The semiconductor device according to claim 3, wherein a P-N junction portion is formed between a silicon substrate or a well on which the select transistor is formed and a drain of the select transistor connected to the one electrode of the capacitor, and the third voltage is applied to the one electrode by the write circuit.

5. The semiconductor device according to claim 4, wherein a plate voltage set to half the third voltage is applied to another electrode of the capacitor.

6. The semiconductor device according to claim 1, wherein the sense amplifier is a single-ended amplifier, and a first transistor having a gate connected to the sense node and a second transistor having a gate to which a sensing period control signal is applied are connected in series between an input/output node of the sense amplifier and a first power supply line receiving the first voltage.

7. The semiconductor device according to claim 6, wherein the input/output node is connected to an input side of the write circuit, the signal voltage amplified by the sense amplifier is transmitted to the write circuit via the input/output node, and the write circuit restores the data into the memory cell using the third voltage.

8. The semiconductor device according to claim 7, wherein the sense amplifier includes a sense amplifier input/output latch latching the signal voltage of the input/output node.

9. The semiconductor device according to claim 1, wherein the sense node is set to a voltage higher than the second voltage in the initial period of the read operation.

10. A semiconductor memory device comprising:

a memory cell storing data in response to stored charge;

a bit line connected to the memory cell;

a transfer control circuit controlling an electrical connection between the bit line and a sense node based on a relation between a reference voltage set for the bit line before the memory cell is connected to the bit line and a voltage of the bit line shifted from the reference voltage when the memory cell is connected to the bit line;

a sense amplifier having a single ended configuration in which the sense node is connected to a gate of a transistor, the sense amplifier amplifying a signal voltage at the sense node; and a write circuit writing data into the memory cell through the bit line based on a write voltage corresponding to data of high-level of the memory cell, wherein the write voltage is set lower than an operation voltage of the sense amplifier, and the transfer control circuit controls so that the bit line is electrically disconnected from the sense node when the voltage of the bit line shifted from the reference voltage is higher than the reference voltage, and the bit line is electrically connected to the sense node when the voltage of the bit line is lower than the reference voltage, in a state in which a voltage at the sense node is set to the operation voltage of the sense amplifier.

11. The semiconductor memory device according to claim 10, wherein the reference voltage is set lower than the write voltage and higher than a voltage corresponding to low-level data of the memory cell.

12. The semiconductor memory device according to claim 10, wherein the transfer control circuit includes a transfer transistor controlling an electrical connection between the bit line and the sense node in response to a transfer control voltage inputted to a gate of the transfer transistor.

13. The semiconductor memory device according to claim 12, wherein the write voltage is higher than the transfer control voltage.

14. The semiconductor memory device according to claim 12, wherein the reference voltage is lower than the transfer control voltage by a threshold voltage of the transfer transistor.

15. The semiconductor memory device according to claim 10, wherein the memory cell includes a capacitor and a select transistor connected between one electrode of the capacitor and the bit line, the select transistor having a gate connected to a word line.

16. The semiconductor memory device according to claim 15, wherein a P-N junction portion is formed between a silicon substrate or a well on which the select transistor is formed and a drain of the select transistor connected to the one electrode of the capacitor, and the third voltage is applied to the one electrode by the write circuit.

17. The semiconductor memory device according to claim 16, wherein a plate voltage set to half the write voltage is applied to another electrode of the capacitor.

18. A data processing system comprising:

a semiconductor device; and a controller connected to the semiconductor device through a bus, the controller processing data stored in the semiconductor device and controlling an operation of the system as a whole and an operation of the semiconductor device, the semiconductor device comprising:

a memory cell storing data;

a bit line connected to the memory cell;

a sense amplifier operating between a first voltage and a second voltage higher than the first voltage, the sense amplifier receiving a signal voltage read out to the bit line in response to the data of the memory cell at a sense node connected to a gate of a transistor and amplifying a voltage at the sense node;

a transfer control circuit including a transfer transistor controlling an electrical connection between the bit line and the sense node in response to a transfer control voltage inputted to a gate;

a write circuit writing data into the memory cell through the bit line based on a write voltage corresponding to data of high-level of the memory cell; and an interface communicating through the bus, wherein the third voltage is set to a voltage lower than the second voltage and higher than the transfer control voltage, and the sense node is set to a voltage higher than the transfer control voltage in an initial period of a read operation before the data of the memory cell is read out to the bit line.

19. The data processing system according to claim 18, wherein a reference voltage of the bit line set in the initial period of the read operation is lower than the transfer control voltage by a threshold voltage of the transfer transistor.

20. The data processing system according to claim 19, wherein the controller includes a command issuing circuit sending commands to the semiconductor device through the bus, and a data processing circuit sending and receiving data to and from the semiconductor device through the bus to perform processes required for the controlling.

*21. A method for reading data in a dynamic random access memory comprising:*

*precharging a bit line to a ground potential;*

*precharging a sense node to a sense node precharge voltage;*

*applying a transfer control voltage to a gate of a transfer transistor connected between the sense node and the bit line to charge the bit line to a reference voltage;*

*driving a word line connected to a gate of a select transistor of a memory cell to a word line supply voltage to connect a capacitor of the memory cell to the bit line;*

*activating a single-ended sense amplifier having an input connected to the sense node to read data in the memory cell; and*

*activating a write circuit having an input connected to an output of the sense amplifier and an output connected to the bit line to restore the data to the memory cell;*

*wherein the reference voltage has a value lower than the transfer control voltage by a threshold voltage of the transfer transistor.*

*22. The method as claimed in claim 21, wherein the write circuit restores a ground potential to the memory cell when the sense amplifier reads low level data in the memory cell and restores a voltage less than the sense node precharge voltage when the sense amplifier reads high level data in the memory cell.*

*23. The method as claimed in claim 22, wherein the voltage less than the sense node precharge voltage is one half the sense node precharge voltage.*

*24. The method as claimed in claim 22, wherein the transfer control voltage is less than the voltage less than the sense node precharge voltage.*

*25. The method as claimed in claim 22, wherein the write circuit comprises:*

*an inverter circuit driven by the voltage less than the sense node precharge voltage and the ground potential and having an input connected to the output of the sense amplifier; and*

*a transistor connected between the output of the inverter and the bit line and having a gate connected to a write control signal.*

*26. The method as claimed in claim 25, wherein the inverter comprises:*

*a PMOS transistor connected between the voltage less than the sense node precharge voltage and the output of the inverter; and*

*an NMOS transistor connected between the ground potential and the output of the inverter; wherein each of the PMOS transistor and the NMOS transistor comprises a gate connected to the output of the sense amplifier.*

*27. The method as claimed in claim 21, wherein the sense amplifier is powered by the sense node precharge voltage.*

*28. The method as claimed in claim 21, wherein the sense node precharge voltage is higher than the voltage powering the sense amplifier.*

*29. The method as claimed in claim 21, wherein the transfer control voltage is less than the sense node precharge voltage.*

*30. The method as claimed in claim 21, wherein the sense amplifier is powered by a voltage equal to the voltage to which the word line is driven.*

*31. The method as claimed in claim 21, wherein the sense node is precharged through a PMOS transistor connected between the sense node and the sense node precharge voltage.*

*32. The method as claimed in claim 21, wherein the sense amplifier comprises a cross coupled pair of CMOS inverters.*

*33. The method as claimed in claim 32, wherein the sense amplifier comprises a detection transistor connected between the cross coupled pair of CMOS inverters and the ground potential and having a gate connected to the sense node.*

*34. The method as claimed in claim 32, wherein the sense amplifier comprises a precharge transistor connected between the cross coupled pair of CMOS inverters and a voltage source.*

* * * * *